(12) United States Patent
Hwang et al.

(10) Patent No.: US 7,231,711 B2
(45) Date of Patent: Jun. 19, 2007

(54) PACKAGING STRUCTURE OF A DRIVING CIRCUIT FOR A LIQUID CRYSTAL DISPLAY DEVICE AND PACKAGING METHOD OF DRIVING CIRCUIT FOR A LIQUID CRYSTAL DISPLAY DEVICE

(75) Inventors: Kwang-Jo Hwang, Gyeonggi-do (KR); Woo-Hyun Kim, Seoul-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 235 days.

(21) Appl. No.: 10/985,909

(22) Filed: Nov. 12, 2004

(65) Prior Publication Data

US 2005/0083742 A1  Apr. 21, 2005

Related U.S. Application Data

(62) Division of application No. 10/103,804, filed on Mar. 25, 2002, now Pat. No. 6,835,896.

(30) Foreign Application Priority Data

Mar. 26, 2001  (KR) ............................... 2001-15563

(51) Int. Cl.
*H01R 43/00* (2006.01)
(52) U.S. Cl. ..................... 29/825; 29/830; 29/846; 156/182
(58) Field of Classification Search .................. 29/825, 29/830, 846; 156/182
See application file for complete search history.

(56) References Cited

U.S. PATENT DOCUMENTS

| | | | | |
|---|---|---|---|---|
| 3,168,617 A | * | 2/1965 | Richter .................. | 174/117 FF |
| 5,274,195 A | * | 12/1993 | Murphy et al. ......... | 174/117 FF |
| 5,346,117 A | * | 9/1994 | Kohn et al. ............ | 228/180.22 |
| 5,347,710 A | * | 9/1994 | Gall et al. .................... | 29/830 |
| 5,363,553 A | * | 11/1994 | Edwards et al. ............... | 29/852 |
| 5,373,109 A | * | 12/1994 | Argyrakis et al. ....... | 174/117 FF |
| 5,403,420 A | * | 4/1995 | Gall et al. .................. | 156/182 |
| 5,432,998 A | * | 7/1995 | Galasco et al. ............... | 29/830 |
| 5,509,196 A | * | 4/1996 | Davis et al. .................. | 29/830 |
| 5,527,997 A | * | 6/1996 | Saen et al. ............... | 174/126.2 |
| 5,590,465 A | * | 1/1997 | Santo .......................... | 29/884 |
| 5,620,782 A | * | 4/1997 | Davis et al. ................. | 428/209 |
| 5,844,783 A | * | 12/1998 | Kojima ...................... | 361/777 |
| 6,049,041 A | * | 4/2000 | Yoshioka et al. ...... | 174/117 FF |

(Continued)

FOREIGN PATENT DOCUMENTS

JP   04048679 A   *   2/1992

(Continued)

*Primary Examiner*—Carl J. Arbes
(74) *Attorney, Agent, or Firm*—McKenna Long & Aldridge LLP

(57) ABSTRACT

A packaging structure of a driving circuit for a liquid crystal display device comprises a base film, a plurality of first metal lines being formed on the base film and being disposed with a certain distance between neighboring first metal lines, an insulating film on the first metal lines, the insulating film exposing both ends of the first metal lines, and a plurality of second metal lines on the insulating film, the second metal lines being formed parallel to the first metal lines.

8 Claims, 9 Drawing Sheets

U.S. PATENT DOCUMENTS

| | | | | |
|---|---|---|---|---|
| 6,055,722 | A * | 5/2000 | Tighe et al. | 29/843 |
| 6,151,091 | A * | 11/2000 | Muramatsu | 349/149 |
| 6,297,868 | B1 * | 10/2001 | Takenaka et al. | 349/151 |
| 6,300,997 | B1 * | 10/2001 | Saito et al. | 349/149 |
| 6,319,019 | B1 * | 11/2001 | Kwon et al. | 439/67 |
| 6,469,252 | B1 * | 10/2002 | Tanaka et al. | 174/117 F |
| 6,509,528 | B1 * | 1/2003 | Mori et al. | 174/255 |

FOREIGN PATENT DOCUMENTS

| | | |
|---|---|---|
| KR | 0147308 B1 | 5/1998 |
| KR | 2000-0053489 A1 | 8/2000 |

* cited by examiner ns for driving the liquid crystal panel 10.
PACKAGING STRUCTURE OF A DRIVING CIRCUIT FOR A LIQUID CRYSTAL DISPLAY DEVICE AND PACKAGING METHOD OF DRIVING CIRCUIT FOR A LIQUID CRYSTAL DISPLAY DEVICE This application is a divisional of application Ser. No. 10/103,804, filed Mar. 25, 2002 now U.S. Pat. No. 6,835,896 which claims priority to Korean Patent Application No. 2001-15563, filed Mar. 26, 2001, each of which are incorporated by reference for all purposes as if fully set forth herein.

BACKGROUND OF THE INVENTION

1. Field of the Invention

The present invention relates to a liquid crystal display (LCD) device and more particularly, to a packaging structure of a driving circuit for a liquid crystal display device and a packaging method of the driving circuit for the liquid crystal display device.

2. Discussion of the Related Art

Flat panel display devices, that are thin, low weight and low power consumption, have been required as the information age rapidly evolves. The liquid crystal display device is widely used for notebook computers and desktop monitors, etc. because of its superior resolution, color image display and quality of displayed images.

Generally, the liquid crystal display device has upper and lower substrates, which are spaced apart and facing each other. Each of the substrate includes an electrode and the electrodes of each upper and lower substrate face each other. Liquid crystal is interposed between the upper substrate and the lower substrate. A voltage is applied to the liquid crystal through the electrodes of each substrate, and thus an alignment of the liquid crystal molecules is changed according the applied voltage to display images.

The liquid crystal display device mainly consists of a liquid crystal panel, which includes liquid crystal between the upper substrate and the lower substrate, a back light behind the liquid crystal panel and a driving unit in an outer side edge of the liquid crystal panel. The driving unit includes a driving circuit, i.e., a drive integrated circuit for applying signals to electric lines of the liquid crystal panel and the driving unit can be one of the following: a chip on glass (COG), a chip on film (COF) and a tape carrier package (TCP) depending on a packaging method of the drive integrated circuit to the liquid crystal panel. With a chip on glass (COG), the drive integrated circuit is packaged on an array substrate of the liquid crystal panel, a size of the liquid crystal panel increases. Whereas a compact structure can be obtained with a chip on film (COF) or the tape carrier package (TCP), because the drive integrated circuit is packaged using a film with the drive integrated circuit that can be bent toward a rear side of the liquid crystal panel. Accordingly, the chip on film (COF) or the tape carrier package (TCP) has been primarily used in the field. The chip on film (COF) or the tape carrier package (TCP) includes the film in which the drive integrated circuit is included.

FIG. 1 is a plan view illustrating a schematic structure of a typical liquid crystal display device that uses the chip on film (COF) or the tape carrier package (TCP). As shown in the figure, the liquid crystal panel 10 includes an array substrate 11 and a color filter substrate 12 and a liquid crystal layer (not shown) is interposed between the array substrate 11 and the color filter substrate 12. Because the array substrate 11 is larger than the color filter substrate 12, a portion of the array substrate 11 is not covered with the color filter substrate 12, and a pad (not shown) is formed on an outer, marginal space of the array substrate 11 to receive a signal to the electric line of the liquid crystal panel 10. The pad of the array substrate 11 is connected to the tape carrier package (TCP) (or the chip on film (COF)) 30 and the tape carrier package (TCP) (or the chip on film (COF)) 30 includes the drive integrated circuit 31 for driving the liquid crystal panel 10. The tape carrier package (TCP) (or the chip on film (COF)) 30 is also connected to a printed circuit board (PCB) 20. Alternatively, a back light (not shown) is positioned behind the liquid crystal panel 10 for a light source. The printed circuit board (PCB) is a board on which a plurality of elements such as an integrated circuit (IC) is formed and generates various control signals and data signals for driving the liquid crystal panel 10.

An anisotropic conductive film (ACF) is used for connecting the tape carrier package (TCP) (or the chip on film (COF)) 30 to the liquid crystal panel 10 or to the printed circuit board (PCB) 20. The anisotropic conductive film (ACF) is a type of a thermosetting resin containing a number of conductive particles. The connecting method for the liquid crystal panel 10 and the tape carrier package (TCP) (or the chip on film (COF)) 30 is as follows. First, the anisotropic conductive film (ACF) is pasted on the pad of the liquid crystal panel 10 and then the tape carrier package (TCP) (or the chip on film (COF)) 30 is attached to the anisotropic conductive film (ACF) on the pad of the liquid crystal panel 10. Finally, if the tape carrier package (TCP) is pressed to the anisotropic conductive film (ACF) using a heat, the tape carrier package (TCP) and the anisotropic conductive film (ACF) are electrically connected each other. Next, it is desirable to apply the proper heat and pressure suited for a material of the tape carrier package (TCP) and the anisotropic conductive film (ACF). The connecting method for the tape carrier package (TCP) (or the chip on film (COF)) 30 and the printed circuit board (PCB) 20 can be performed with the same process as that of the tape carrier package (TCP) 30 and the liquid crystal panel 10. Since the tape carrier package (TCP) and the chip on film (COF) use the film that is flexible, they are suitable for a compact structure. However, because a metal line thickness of the chip on film (COF) is thinner than a metal line thickness of the tape carrier package (TCP), the chip on film (COF) is suitable for patterning, and can have a finer structure than the tape carrier package (TCP).

A structure and a manufacturing process of the chip on film (COF) will be described hereinafter with reference to the figures. FIG. 2A and FIG. 2B being plan views illustrating a structure of a conventional chip on film (COF). FIG. 2A illustrates the chip on film (COF) of a gate driving circuit for applying a voltage to a gate signal line of the liquid crystal panel, and FIG. 2B illustrates the chip on film (COF) of a data driving circuit for applying a voltage to a data signal line of the liquid crystal panel. As shown in the figures, a plurality of input metal lines 60 and a plurality of output metal lines 70 are formed on a base film 50, maintaining a certain distance between them. An overcoat layer 80 is formed on the input metal lines 60 and the output metal lines 70. The overcoat layer 80 exposes terminals of the input metal lines 60 and the output metal lines 70; the drive integrated circuit 90 is connected to the terminals at one end of the input metal lines 60 and the output metal lines 70, respectively. Other terminals at the other end of the output metal lines 70 are connected to a gate pad (not shown) or a data pad (not shown) and other terminals at the other end of the input metal lines 60 are connected to the external printed circuit board (PCB). Each of the output metal lines 70 must correspond to each signal line of the liquid crystal panel. However, the number input metal lines 60 only have to be sufficient to deliver a signal generated in the printed circuit board (PCB) to the drive integrated circuit 90. Accordingly, fewer input metal lines 60 may be formed than the output metal lines 70 with a larger space between them than the output metal lines 70.

FIGS. 3A to 3C are plan views illustrating a packaging process of a chip on film (COF) of a data driving circuit according to the related art. In FIG. 3A, a plurality of input metal lines 60 and a plurality of output metal lines 70 are formed by patterning a metal film on a base film 50. Next, the input metal lines 60 and the output metal lines 70 are formed keeping a certain distance respectively between them. As described before, the input metal lines 60 can be formed with a larger interval space than the output metal lines 70.

In FIG. 3B, an overcoat layer 80, which exposes terminals of the input metal lines 60 and the output metal lines 70, is formed on the input metal lines 60 and the output metal lines 70, by patterning an insulating material on the input metal lines 60 and the output metal lines 70. The terminals at one end of the input metal lines 60 and the terminals adjacent thereto are exposed through an opening 81 of the overcoat layer 80.

In FIG. 3C, the exposed terminals of the input metal lines 60 and the output metal lines 70 are connected to a drive integrated circuit 90. The chip on film (COF) is attached to the liquid crystal panel and the printed circuit board (PCB) using an anisotropic conductive film (ACF) after the chip on film (COF) is manufactured according to the above processes.

FIG. 4 is a cross-sectional view taken along IV-IV of FIG. 3C. As shown in the figure, a pad pitch is defined as a summation of a terminal width "a" of the output metal lines 70 and a distance "d" between two output metal lines 70. An attainable minimum pad pitch of the chip on film (COF) is about 50 μm, considering a patterning accuracy for the metal film that is used for the metal lines, and prevention of an electric short during pasting the anisotropic conductive film (ACF). A liquid crystal display device has many pixels, one pixel consisting of three sub-pixels for red (R), green (G), and blue (B) colors. A pixel pitch is defined as a width of the sub-pixel. Because there is a space between two neighboring chip on films (COF), the pad pitch is smaller than the pixel pitch. With the demand for devices that have higher resolutions as the number of the pixels in a given area has increased while the pixel size is decreased. Accordingly, the pixel pitch and the pad pitch are being decreased. In case of a high-resolution liquid crystal display device, which has 200 to 300 pixels per inch (from 200 to 300 PPI), a maximum pixel pitch is 42 μm, and the pad pitch must be smaller than the maximum pixel pitch. Accordingly, a minimum pad pitch that can be achieved by now is 50 μm as described before, the chip on film (COF) (or the tape carrier package (TCP)) in FIG. 3C cannot be used for a high-resolution liquid crystal display device.

To overcome this problem, the pad pitch can be made greater than the pixel pitch by forming an area for packaging the chip on films (COF) larger than that of FIG. 1 as shown FIG. 5A. A double bank structure in which the chip on films (COF) are packaged in upper and lower sides of the liquid crystal panel may alternatively be used for the high-resolution liquid crystal display device as shown FIG. 5B. However, as the volume of the liquid crystal panel increases, the cost increases for the manufacturing process of a driving circuit and module.

SUMMARY OF THE INVENTION

The present invention is directed to a packaging structure of a driving circuit for a liquid crystal display device and a packaging method of the driving circuit for the liquid crystal display device that substantially obviates one or more of problems due to limitations and disadvantages of the related art.

An advantage of the present invention is to provide a packaging structure of a driving circuit that is suitable for a high-resolution liquid crystal display device.

Another advantage of the present invention is to provide a packaging method of a driving circuit for the high-resolution liquid crystal display device.

Additional features and advantages of the invention will be set forth in the description which follows, and in part will be apparent from the description, or may be learned by practice of the invention. These and other advantages of the invention will be realized and attained by the structure in the written description and claims hereof as well as the appended drawings.

To achieve these and other advantages and in accordance with the purpose of the present invention, as embodied and broadly described, a packaging structure of a driving circuit for a liquid crystal display device comprises a base film, a plurality of first metal lines being formed on the base film and being disposed with a certain distance between neighboring first metal lines, an insulating film on the first metal lines, the insulating film exposing both ends of the first metal lines, and a plurality of second metal lines on the insulating film, the second metal lines being formed parallel to the first metal lines. The first metal line consists of two terminals at both ends of the first metal line, a connection part between the two terminals; the connection part being narrower in width than the terminals. The second metal lines correspond to the connection parts of the first metal lines and are disposed in an alternating order with the connection parts of the first metal lines. The second metal line consists of two terminals at both ends of the second metal line and a connection part between the two terminals; the width of the connection part of the second metal line being wider than a width of the connection part of the first metal line. The packaging structure of the driving circuit of the liquid crystal display device may further include an overcoat layer that exposes both ends of the first metal lines and the second metal lines, and a drive integrated circuit that is connected to the terminals at one end of the first metal lines and the adjacent terminals of the second metal lines. The first metal line and the second metal line may be formed of copper (Cu).

A packaging method of a driving circuit of a liquid crystal display device comprises the steps of preparing a base film, forming a plurality of first metal lines on the base film, forming an insulating film on the first metal lines, and exposing both ends of the first metal lines, forming a plurality of second metal lines on the insulating film, and forming an overcoat layer on the second metal lines, the overcoat layer exposing both ends of the first metal lines and the second metal lines.

According to the present invention, two output metal lines are formed in a pitch by forming a double layered output metal line of the chip on film (COF) (or the tape carrier package (TCP)) achieving a high-resolution liquid crystal display device that has more than 300 pixels per inch. Accordingly, the present invention can provide a compact high-resolution liquid crystal display device without increasing a volume of the liquid crystal display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 1:
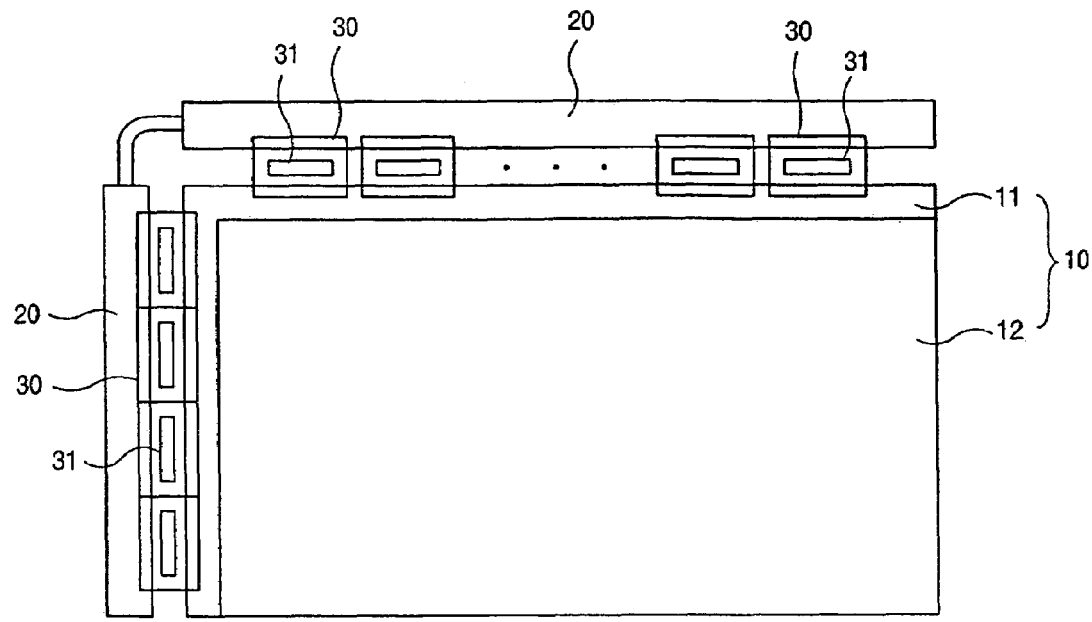
FIG. 1 is a plan view illustrating a schematic structure of a typical liquid crystal display device that uses a chip on film (COF) or a tape carrier package (TCP) according to the related art.
Figure 2A:
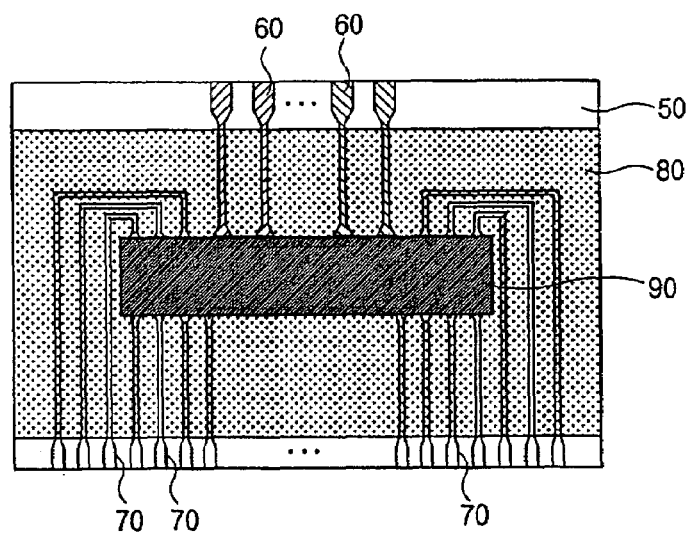
FIG. 2A and FIG. 2B are plan views illustrating packaging structures of a chip on film (COF) of a gate driving circuit and a data driving circuit respectively according to the related art.
Figure 2B:
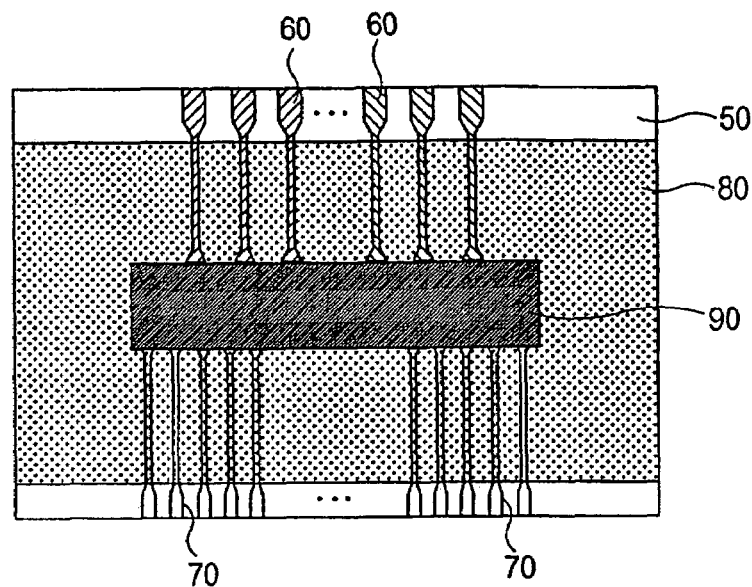
Figure 3A:
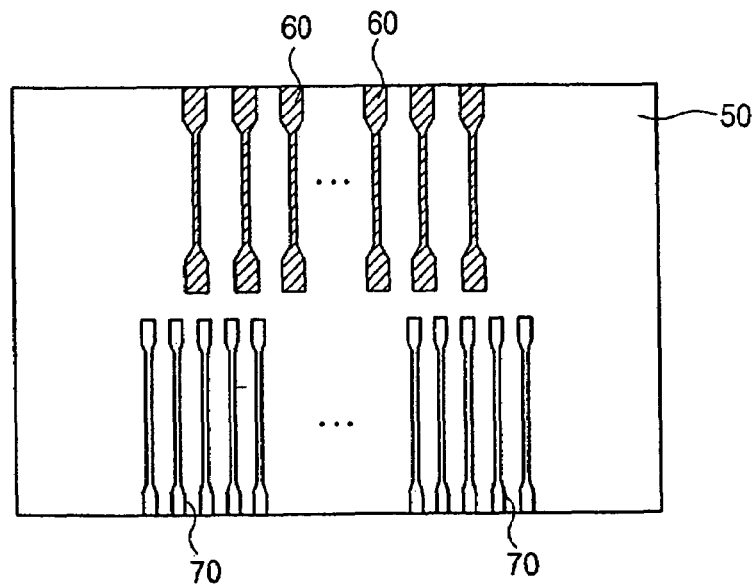
FIGS. 3A to 3C are plan views illustrating a packaging process of a chip on film (COF) of a data driving circuit according to the related art.
Figure 3B:
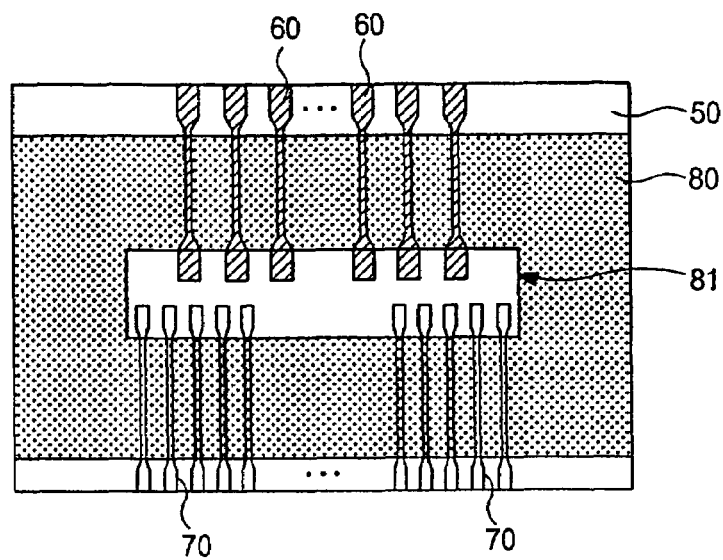
Figure 3C:
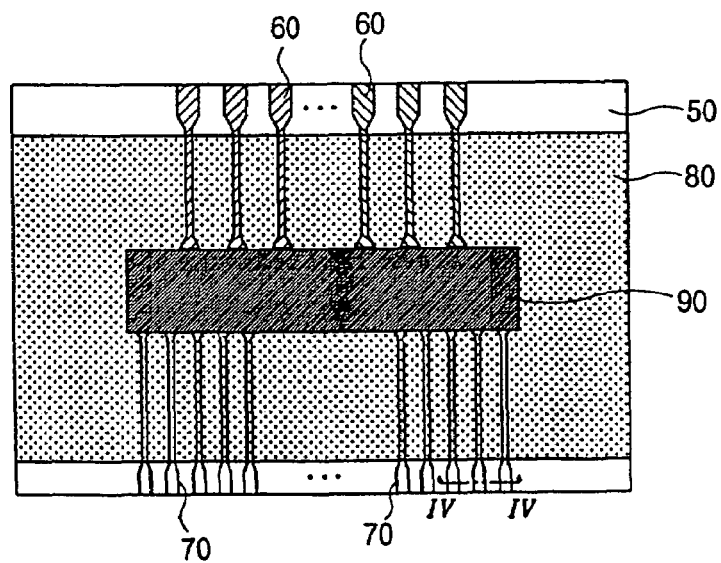
Figure 4:
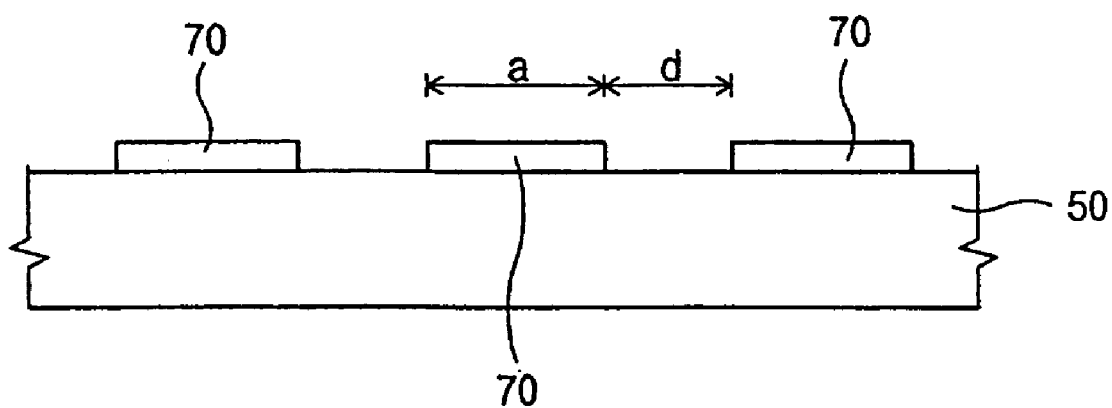
FIG. 4 is a cross-sectional view taken along IV-IV of FIG. 3C.
Figure 5A:
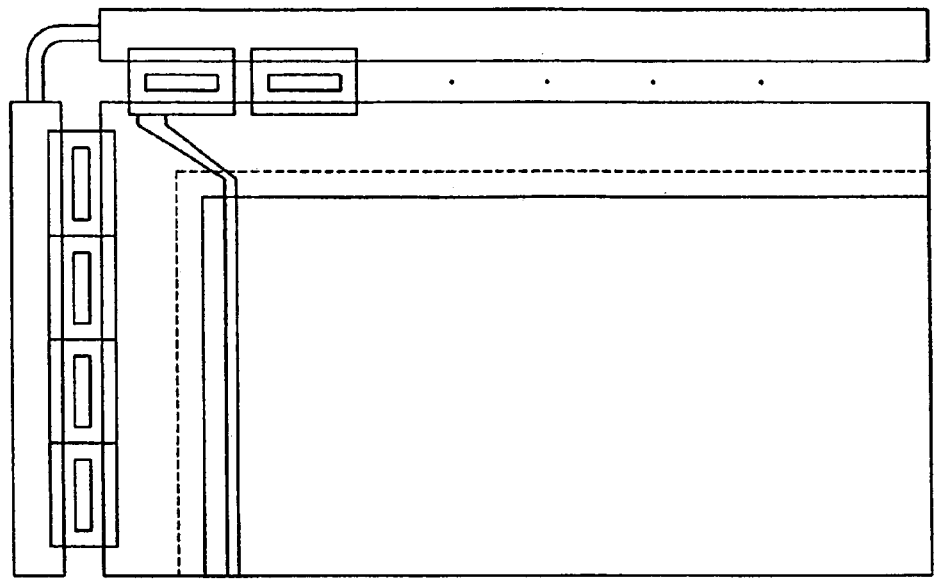
FIG. 5A and FIG. 5B are plan views illustrating another packaging structure for a typical liquid crystal display device according to the related art.
Figure 5B:
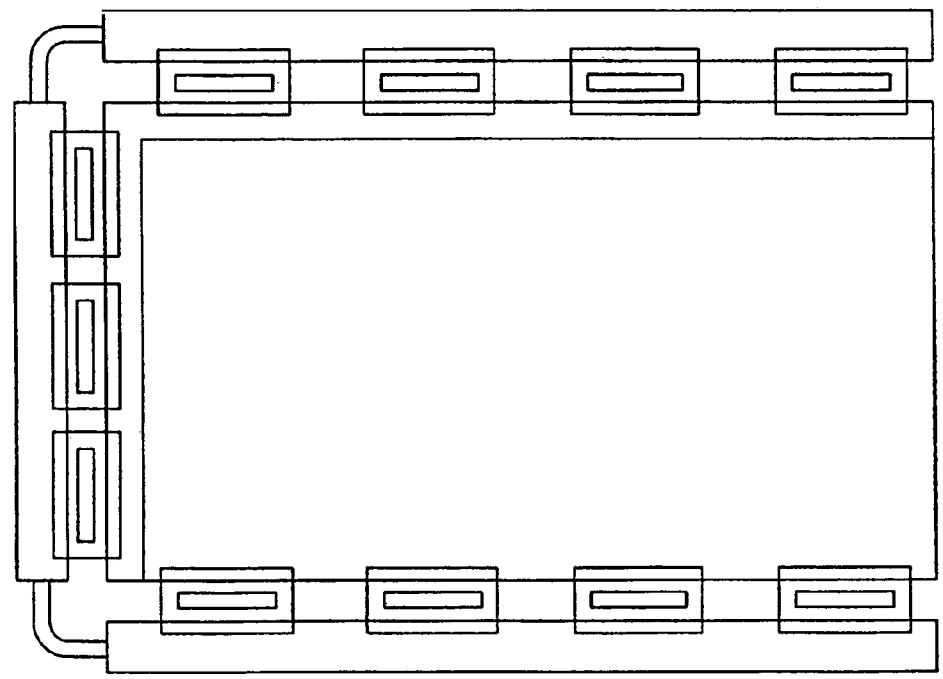
Figure 6:
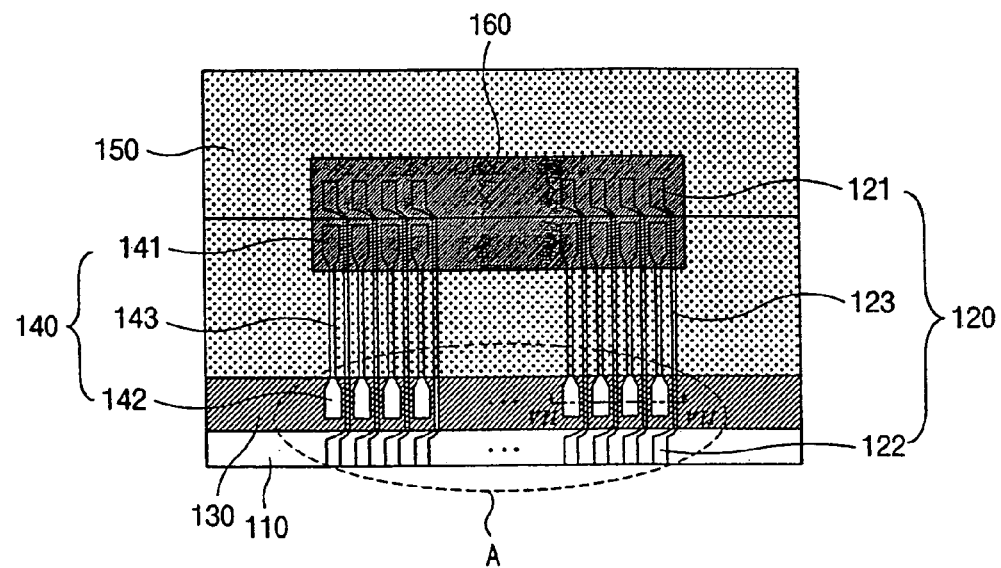
FIG. 6 is a plan view illustrating a packaging structure of a chip on film (COF) of a data driving circuit according to the present invention.
Figure 7:
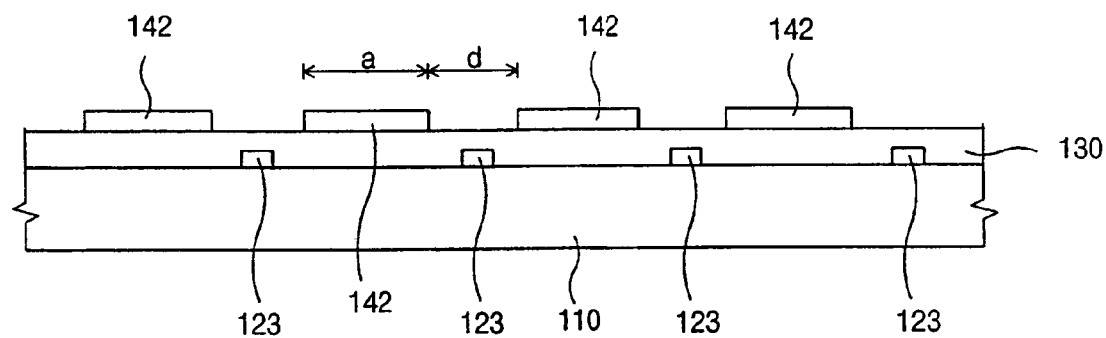
FIG. 7 is a cross-sectional view taken along VII-VII of FIG. 6.

FIG. 6 is a plan view illustrating a packaging structure of a chip on film (COF) of a data driving circuit according to the present invention. FIG. 7 is a cross-sectional view taken along VII-VII of FIG. 6. Because the structure of input metal lines has been described before, the following description of output metal lines will be described with reference to related figures.

In FIG. 6 and FIG. 7, a plurality of first output lines 120 is formed on a base film 110 with a specific distance between the first output lines 120. The first output line 120 consists of two terminals 121 and 122 at respective ends of the first output line 120 and a connection part 123 that connects the two terminals and has a narrower width than the terminals 121 and 122. The connection part 123 is positioned to a right side of the terminals 121 and 122 in FIG. 6, but connection part 123 may be positioned to a left side of the terminals 121 and 122. An insulating film 130 is formed on the first output lines 120 and the insulating film 130 exposes the terminals 121 and 122 of the first output lines 120. A plurality of second output lines 140 is formed on the insulating film 130 with a specific distance between the second output lines 140. The second output line 140 also consists of two terminals 141 and 142 and a connection part 143, and a width of the connection part 143 is narrower than the terminals 141 and 142. The second output lines 140 are shorter than the first output lines 120, and formed in a same line as the terminals 121 and 122 of the first output lines 120. That is, the second output lines 140 correspond to the connection parts of the first output lines 120, and are disposed in an alternating order with the first output lines 120. It is desirable to prevent an occurrence of signal interference by avoiding an overlap of the second output lines 140 with the first output lines 120. In order to prevent signal interference, an overcoat layer 150 is formed on the second output lines 140. The overcoat layer 150 exposes all of first and second terminals 121 and 122 of the first output lines 120 and all of first and second terminals 141 and 142 of the second output lines 140. A drive integrated circuit 160 is disposed on the overcoat layer 150 and connected to the first terminals 121 of the first output lines 120 and the first terminals 141 of the second output lines 140.

Two output lines 120 and 140 can be formed in a pad pitch by double layering the output lines using the insulating film in the present invention. A minimum pad pitch of 50 μm, can now be achieved, and with the following calculation, the number of output lines per inch is as follows.

$$\{25,400(\mu m)/50(\mu m)\} \times 2 = 1,016$$

Figure 8A:
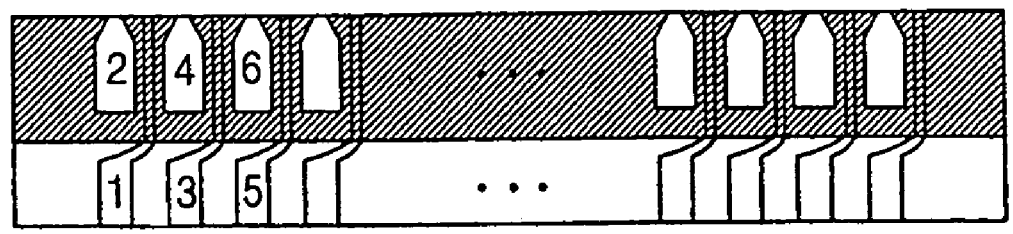
FIG. 8A to FIG. 8B are enlarged views for "A" of FIG. 6.
Figure 8B:
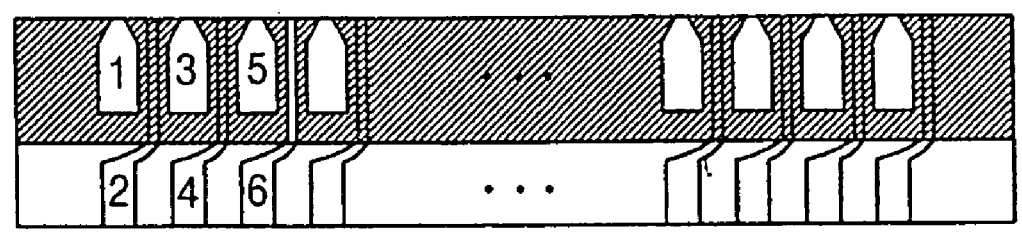

Since one pixel includes three sub-pixels, the output lines that are equivalent to 339 pixels per inch can be supplied. Accordingly, a high-resolution liquid crystal display device that has 200 to 300 pixels per inch (200 to 300 PPI) can be achieved. At this time, an output signal of the drive integrated circuit 160 is applied to the first output line 120 and the second output line 140 alternatively to deliver the output signal uniformly as shown in FIG. 8A and FIG. 8B. That is, the output signal may be applied to the first output lines 120 and the second output lines 140 according to marked numbers of the output lines, as shown in FIG. 8A, or according to marked numbers of the output lines, as shown in FIG. 8B.

Figure 9A:
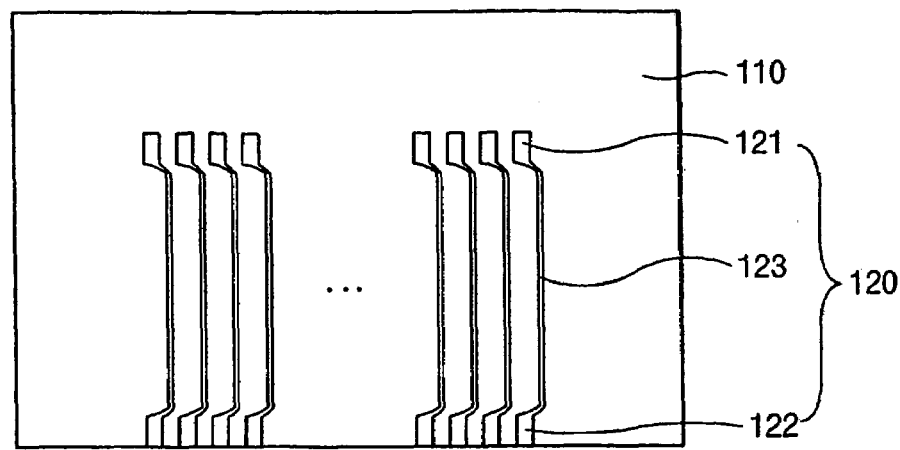
FIGS. 9A to 9D are plan views illustrating a packaging process of a chip on film (COF) of a data driving circuit according to the present invention.

FIGS. 9A to 9D are plan views illustrating a packaging method of a data driving circuit of the present invention according to sequential processes. In FIG. 9A, a plurality of first output lines 120 is formed on a base film 110 by patterning a metal film on the base film 110. The first output line 120 consists of two terminals 121 and 122 at both ends of the first output line, and a connection part 123 between the two terminals 121 and 122. The first output line 120 may be formed of material having a low specific resistance such as copper (Cu).

Figure 9B:
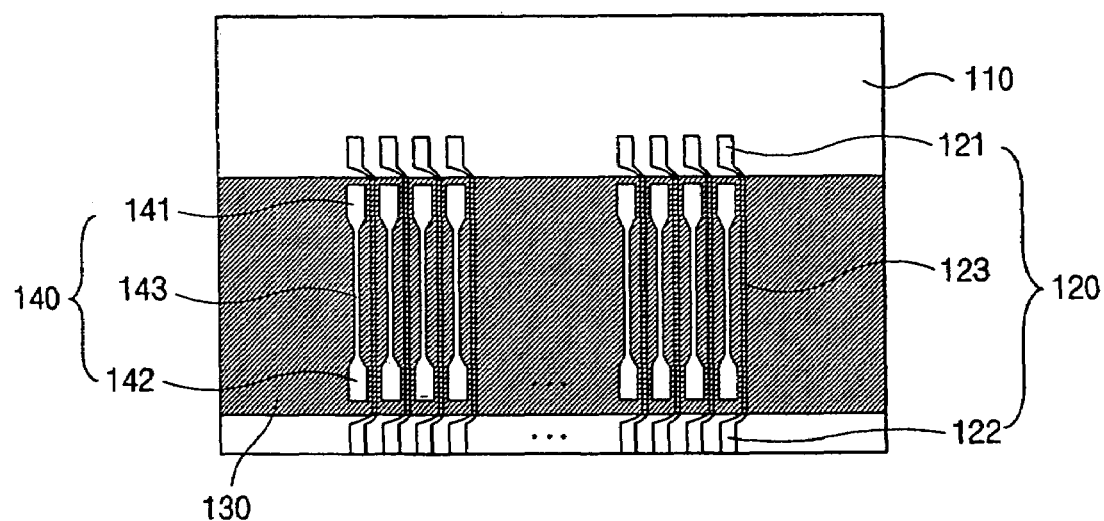

In FIG. 9B, an insulating film 130, which covers only the connection parts 123 of the first output lines 120, is formed on the first output lines 120 by depositing or coating insulating material and then patterning the insulating material. A plurality of second output lines 140 is formed on the insulating film 130 by forming a metal film on the insulating film 130 and patterning the metal film. The second output line 140 also consists of two terminals 141 and 142 and a connection part 143. The second output lines 140 are shorter than the first output lines 120, and are disposed in an alternating order with the first output lines. The second output lines 140 correspond to the connection parts of the first output lines 120. The second output lines 140 may also be formed of material having a low specific resistance such as copper (Cu). Because there is a difference between a length of the first output line 120 and the second output line 140, there exists a difference of a specific resistance between the first output line 120 and the second output line 140. The different specific resistances can be overcome by controlling widths of the two output lines 120 and 140. That is, the specific resistance can be held at a constant value by having the width of the connection part 123 of the first output line 120 narrower than the width of the connection part 143 of the second output line 140.

Figure 9C:
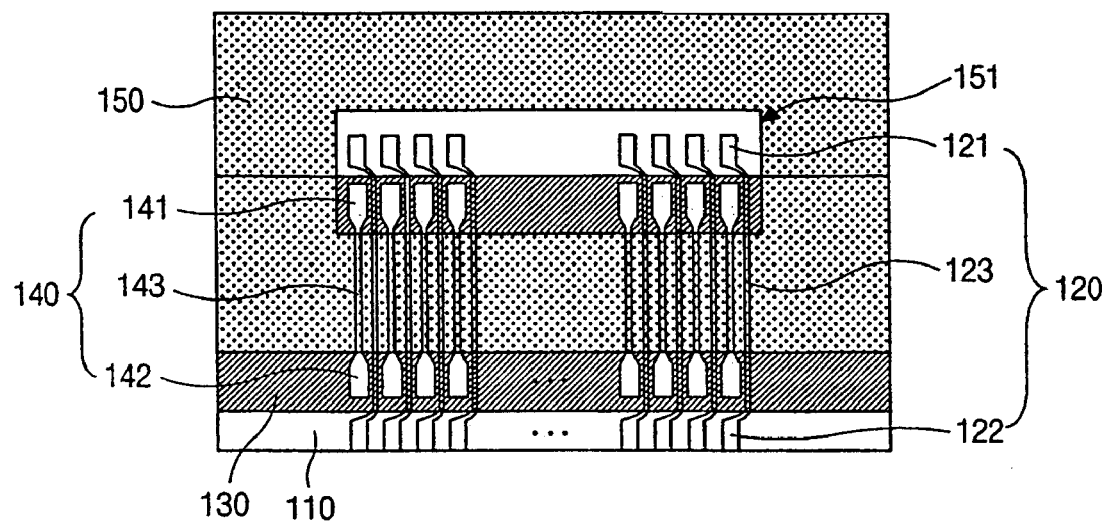

In FIG. 9C, an overcoat layer 150 is formed by depositing or coating insulating material on the second output lines 140 and patterning the insulating material. The overcoat layer 150 exposes all of the first and second terminals 121, 122, 141 and 142 of the first and second output lines 120 and 140. The first terminals 121 and 141 of the first and second output lines 120 and 140 are exposed through an opening 151.

Figure 9D:
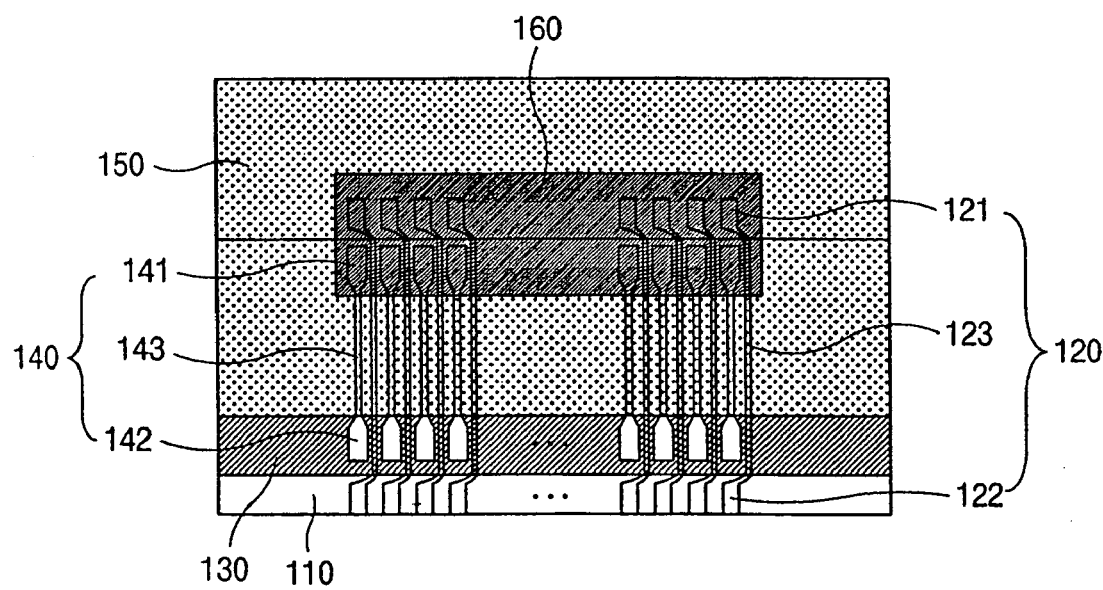

In FIG. 9D, a drive integrated circuit 160 is disposed on the opening 151 and connected to the first terminals 121 and 141 of the first and second output lines 120 and 140.

The output lines of the chip on film (COF) can be formed by double layering the insulating film in the present invention. Although it has been described herein with the packaging structure and the packaging method of the chip on film (COF), the same method can be adapted to a tape carrier package (TCP).

It will be apparent to those skilled in the art that various modifications and variation can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A packaging method of a driving circuit of a liquid crystal display device, comprising:
    preparing a base film;
    forming a plurality of first metal lines on the base film;
    forming an insulating film on the first metal lines, the insulating film exposing both ends of the first metal lines;
    forming a plurality of second metal lines on the insulating film; and
    forming an overcoat layer on the second metal lines, the overcoat layer exposing both ends of the first metal lines and the second metal lines.

2. The packaging method according to claim 1, wherein the first metal line includes two terminals, each at a respective end of the first metal line and a connection part between the two terminals.

3. The packaging method according to claim 2, wherein the connection part being a narrower width than the terminals.

4. The packaging method according to claim 2, wherein the second metal lines correspond to the connection parts of the first metal lines and being disposed in an alternating order with the connection parts of the first metal lines.

5. The packaging method according to claim 1, wherein the second metal line includes two terminals, each at a respective end of the second metal line and a connection part between the two terminals.

6. The packaging method according to claim 5, wherein a width of the connection part of the second metal line being wider than a width of the connection part of the first metal line.

7. The packaging method according to claim 1, further comprising a step of forming a drive integrated circuit on the overcoat layer.

8. The packaging method according to claim 1, wherein the first metal line and the second metal line include copper (Cu).

* * * * *